United States Patent
Yamauchi et al.

(10) Patent No.: US 9,692,371 B2
(45) Date of Patent: Jun. 27, 2017

(54) CURRENT FEEDBACK OUTPUT CIRCUIT

(71) Applicant: Kabushiki Kaisha Toshiba, Minato-ku, Tokyo (JP)

(72) Inventors: Akira Yamauchi, Yokohama (JP); Hiroyuki Tsurumi, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/733,402

(22) Filed: Jun. 8, 2015

(65) Prior Publication Data

US 2015/0270815 A1    Sep. 24, 2015

Related U.S. Application Data

(63) Continuation of application No. 14/013,967, filed on Aug. 29, 2013, now Pat. No. 9,083,295.

(30) Foreign Application Priority Data

Dec. 18, 2012  (JP) ................. 2012-275434

(51) Int. Cl.
    *H03F 1/34*    (2006.01)
    *H03F 3/21*    (2006.01)
    (Continued)

(52) U.S. Cl.
    CPC ............. *H03F 3/211* (2013.01); *H03F 1/342* (2013.01); *H03F 3/3028* (2013.01);
    (Continued)

(58) Field of Classification Search
    CPC ................. H03F 1/34; H03F 3/45; H03F 3/68
    (Continued)

(56) References Cited

U.S. PATENT DOCUMENTS 7,327,194 B2   2/2008   Li
7,518,454 B2   4/2009   Yamashita
(Continued)

FOREIGN PATENT DOCUMENTS

JP    2002-353746 A    12/2002
JP    2005-151427 A     6/2005
(Continued)

OTHER PUBLICATIONS

Japanese Office Action issued Jun. 26, 2015 in Japanese Application No. 2012-275434, and an English translation thereof.

*Primary Examiner* — Steven J Mottola
(74) *Attorney, Agent, or Firm* — White & Case LLP

(57) ABSTRACT

The current feedback output circuit includes first and second transistors. The current feedback output circuit includes a current amplifier that has a non-inverting input terminal, an inverting input terminal, a first output terminal and a second output terminal, an input impedance of the non-inverting input terminal being higher than an input impedance of the inverting input terminal, and flows a current obtained by amplifying the difference between a current of an input signal to the non-inverting input terminal and a current input to the inverting input terminal between the first output terminal and the second output terminal. The current feedback output circuit includes first to sixth current mirror circuits. The current feedback output circuit includes a current feedback circuit that supplies a current responsive to a voltage at the signal output terminal to the inverting input terminal.

9 Claims, 4 Drawing Sheets

(51) Int. Cl.
 *H03F 3/30* (2006.01)
 *H03F 3/45* (2006.01)
(52) U.S. Cl.
 CPC ..... *H03F 3/45475* (2013.01); *H03F 2200/03* (2013.01); *H03F 2200/135* (2013.01); *H03F 2200/91* (2013.01); *H03F 2203/21181* (2013.01); *H03F 2203/45138* (2013.01); *H03F 2203/45511* (2013.01)
(58) Field of Classification Search
 USPC ............. 330/69, 98, 99, 100, 102, 103
 See application file for complete search history.

(56) References Cited

U.S. PATENT DOCUMENTS

| | | | |
|---|---|---|---|
| 7,986,187 B1 * | 7/2011 | Nussbaum | H03F 3/2178 330/207 A |
| 8,193,863 B2 | 6/2012 | Tsurumi | |
| 2005/0206452 A1 | 9/2005 | Lehto | |
| 2007/0120604 A1 | 5/2007 | Li | |
| 2008/0224772 A1 | 9/2008 | Yamashita | |
| 2011/0163809 A1 | 7/2011 | Tsurumi | |
| 2011/0285466 A1 | 11/2011 | Takida et al. | |
| 2013/0057341 A1 * | 3/2013 | Sobukawa | H03F 1/34 330/100 |

FOREIGN PATENT DOCUMENTS

| | | |
|---|---|---|
| JP | 2007-159117 A | 6/2007 |
| JP | 2011-142402 A | 7/2011 |
| JP | 2011-244324 A | 12/2011 |

* cited by examiner

CURRENT FEEDBACK OUTPUT CIRCUIT

CROSS-REFERENCE TO RELATED APPLICATION

This application is a continuation of application Ser. No. 14/013,967 filed on Aug. 29, 2013 which is based upon and claims the benefit of priority from the prior Japanese Patent Application No. 2012-275434, filed on Dec. 18, 2012, the entire contents of each are incorporated herein by reference.

BACKGROUND

Field

Embodiments described herein relate generally to a current feedback output circuit.

Background Art

There is a MOS-type output circuit applicable to an audio power amplifying circuit.

DETAILED DESCRIPTION

Figure 1:
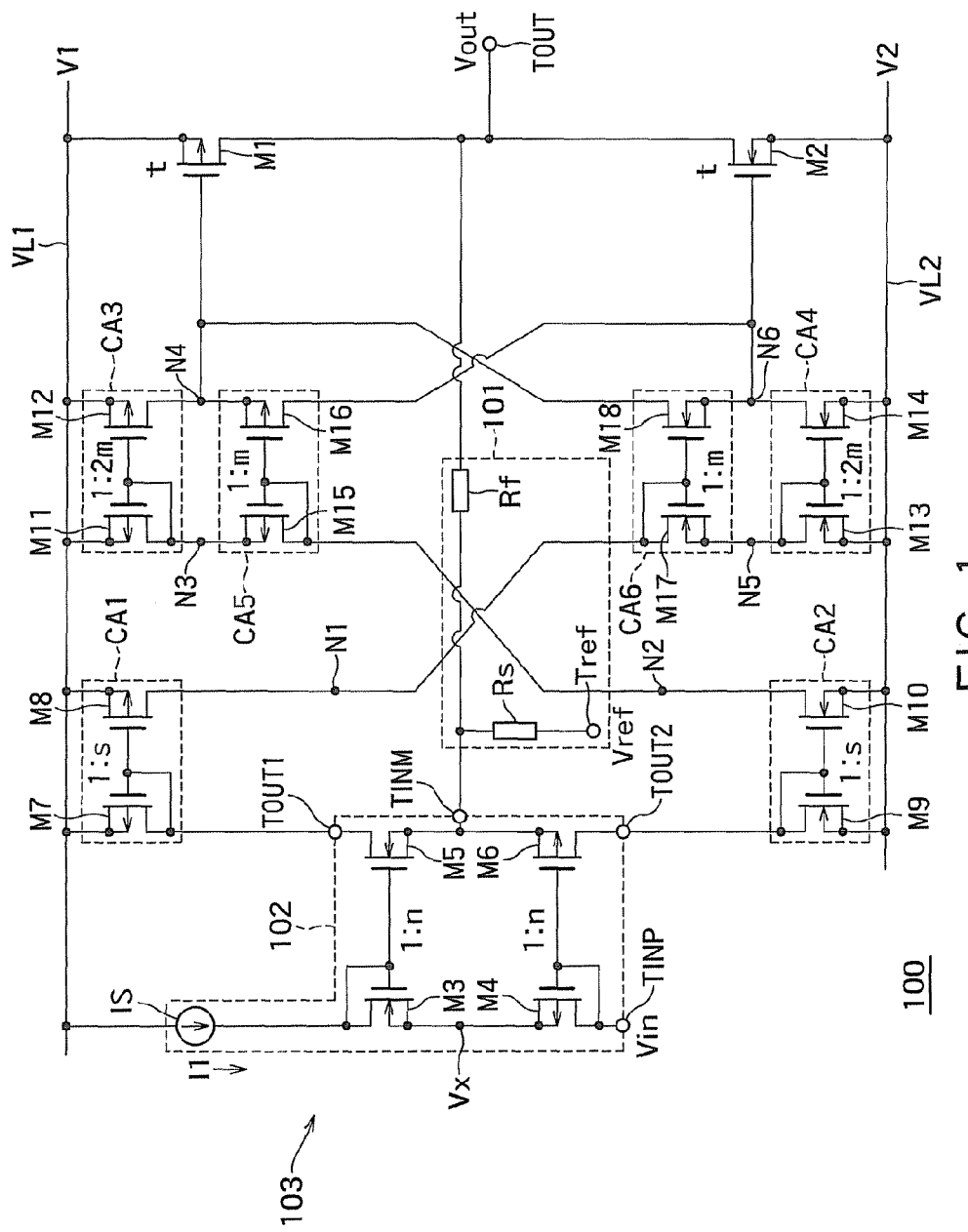
FIG. 1 is a circuit diagram showing an example of a configuration of a current feedback output circuit 100 according to a first embodiment, which is an aspect of the present invention.

A current feedback output circuit according to an embodiment includes a signal output terminal at which an output signal is output. The current feedback output circuit includes a first transistor of a first conductivity type that is connected between the signal output terminal and a first power supply rail, a first voltage being applied to the first power supply rail. The current feedback output circuit includes a second transistor of a second conductivity type, which is different from the first conductivity type, that is connected between the signal output terminal and a second power supply rail, a second voltage, which is lower than the first voltage, being applied to the second power supply rail. The current feedback output circuit includes a current amplifier that has a non-inverting input terminal, an inverting input terminal, a first output terminal and a second output terminal, an input impedance of the non-inverting input terminal being higher than an input impedance of the inverting input terminal, and flows a current obtained by amplifying the difference between a current of an input signal to the non-inverting input terminal and a current input to the inverting input terminal between the first output terminal and the second output terminal. The current feedback output circuit includes a first current mirror circuit that flows a first mirror current, which is a mirror current of a current flowing between the first power supply rail and the first output terminal, between the first power supply rail and a first node. The current feedback output circuit includes a second current mirror circuit that flows a second mirror current, which is a mirror current of a current flowing between the second power supply rail and the second output terminal, between the second power supply rail and a second node. The current feedback output circuit includes a third current mirror circuit that flows a third mirror current, which is a mirror current of a current flowing between the first power supply rail and a third node, between the first power supply rail and a fourth node, which is connected to a control terminal of the first transistor. The current feedback output circuit includes a fourth current mirror circuit that flows a fourth mirror current, which is a mirror current of a current flowing between the second power supply rail and a fifth node, between the first power supply rail and a sixth node, which is connected to a control terminal of the second transistor. The current feedback output circuit includes a fifth current mirror circuit that flows a fifth mirror current, which is a mirror current of a current flowing between the third node and the second node, between the fourth node and the sixth node. The current feedback output circuit includes a sixth current mirror circuit that flows a sixth mirror current, which is a mirror current of a current flowing between the fifth node and the first node, between the sixth node and the fourth node. The current feedback output circuit includes a current feedback circuit that supplies a current responsive to a voltage at the signal output terminal to the inverting input terminal.

DETAILED DESCRIPTION OF THE INVENTION

In the following, embodiments of the present invention will be described with reference to the drawings. In the following description, it is assumed that a transistor of a first conductivity type is a pMOS transistor, and a transistor of a second conductivity type is an nMOS transistor. In a case where a bipolar transistor is used, however, a transistor of a first conductivity type corresponds to a PNP transistor, and a transistor of a second conductivity type corresponds to an NPN transistor.

First Embodiment

FIG. 1 is a circuit diagram showing an example of a configuration of a current feedback output circuit 100 according to a first embodiment, which is an aspect of the present invention.

As shown in FIG. 1, the current feedback output circuit 100 includes a first power supply rail "VL1", a second power supply rail "VL2", a signal output terminal "TOUT", a first transistor "M1" (pMOS transistor) of a first conductivity type, a second transistor "M2" (nMOS transistor) of a second conductivity type, which is different from the first conductivity type, a first current mirror circuit "CA1", a second current mirror circuit "CA2", a third current mirror circuit "CA3", a fourth current mirror circuit "CA4", a fifth current mirror circuit "CA5", a sixth current mirror circuit "CA6", a current feedback circuit 101 and a current amplifier 102.

The current amplifier 102, the first to sixth current mirror circuits "CA1" to "CA6", the first transistor "M1" of the first conductivity type and the second transistor "M2" of the second conductivity type form an amplifier 103.

A first voltage (power supply voltage, for example) "V1" is supplied to the first power supply rail "VL1".

A second voltage (ground voltage, for example) "V2", which is lower than the first voltage "V1", is supplied to the second power supply rail "VL2".

The signal output terminal "TOUT" is configured to output an output signal "Vout".

The first transistor "M1" is connected between the signal output terminal "TOUT" and the first power supply rail "VL1" to which the first voltage "V1" is applied.

The second transistor "M2" is connected between the signal output terminal "TOUT" and the second power supply rail "VL2" to which the second voltage "V2" lower than the first voltage "V1" is applied.

The current amplifier 102 has a non-inverting input terminal "TINP", an inverting input terminal "TINM", a first output terminal "TOUT1" and a second output terminal "TOUT2". The non-inverting input terminal "TINP" is characterized by a high input impedance, and the inverting input terminal "TINM" is characterized by a low input impedance. That is, the input impedance of the first output terminal "TOUT1" is higher than the input impedance of the second output terminal "TOUT2". The current amplifier 102 is configured to pass a current obtained by amplifying the difference between the current of the signal input to the non-inverting input terminal "TINP" and the current input to the inverting input terminal "TINM" as the difference of the current between the first output terminal "TOUT1" and the second output terminal "TOUT2". If the current input to the non-inverting input terminal "TINP" and the current input to the inverting input terminal "TINM" are equal to each other, the current flowing to the first output terminal "TOUT1" and the current flowing to the second output terminal "TOUT2" are equal to each other.

As shown in FIG. 1, the current amplifier 102 includes a current source "IS", a third transistor (nMOS transistor) "M3" of the second conductivity type, a fourth transistor (pMOS transistor) "M4" of the first conductivity type, a fifth transistor (nMOS transistor) "M5" of the second conductivity type and a sixth transistor (pMOS transistor) "M6" of the first conductivity type, for example.

The current source "IS" is connected to the first power supply rail "VL1" at one end thereof and is configured to output a current "I1".

The third transistor "M3" is connected to another end of the current source "IS" at one end (drain) thereof and is diode-connected.

The fourth transistor "M4" is connected to another end (source) of the third transistor "M3" at one end (source) thereof and to the non-inverting input terminal "TINP" at another end (drain) thereof and is diode-connected.

The fifth transistor "M5" is connected to the first output terminal "TOUT1" at one end (drain) thereof, to the inverting input terminal "TINM" at another end (source) thereof and to a control terminal (gate) of the third transistor "M3" at a control terminal (gate) thereof.

The sixth transistor "M6" is connected to the inverting input terminal "TINM" at one end (source) thereof, to the second output terminal "TOUT2" at another end (drain) thereof and to a control terminal (gate) of the fourth transistor "M4" at a control terminal (gate) thereof.

The third and fifth transistors "M3" and "M5" form a current mirror circuit. The mirror ratio of the current mirror circuit (area ratio between the third and fifth transistors "M3" and "M5") is 1:n (n≥1). The fourth and sixth transistors "M4" and "M6" form a current mirror circuit. The mirror ratio of the current mirror circuit (area ratio between the fourth and sixth transistors "M4" and "M6") is 1:n (n≥1).

That is, the mirror ratio of the current mirror circuit formed by the fourth and sixth transistors "M4" and "M6" is set to be equal to the mirror ratio of the current mirror circuit formed by the third and fifth transistors "M3" and "M5".

As shown in FIG. 1, the first current mirror circuit "CA1" is configured to flow a first mirror current, which is a mirror current of a current flowing between the first power supply rail "VL1" and the first output terminal "TOUT1", between the first power supply rail "VL1" and a first node "N1".

As shown in FIG. 1, the first current mirror circuit "CA1" includes a seventh transistor (pMOS transistor) "M7" of the first conductivity type and an eighth transistor (pMOS transistor) "M8" of the first conductivity type, for example.

The seventh transistor "M7" is connected to the first power supply rail "VL1" at one end (source) thereof and to the first output terminal "TOUT1" at another end (drain) thereof and is diode-connected.

The eighth transistor "M8" is connected to the first power supply rail "VL1" at one end (source) thereof, to the first node "N1" at another end (drain) thereof and to a control terminal (gate) of the seventh transistor "M7" at a control terminal (gate) thereof.

The second current mirror circuit "CA2" is configured to flow a second mirror current, which is a mirror current of a current flowing between the second power supply rail "VL2" and the second output terminal "TOUT2", between the second power supply rail "VL2" and a second node "N2".

As shown in FIG. 1, the second current mirror circuit "CA2" includes a ninth transistor (nMOS transistor) "M9" of the second conductivity type and a tenth transistor (nMOS transistor) "M10" of the second conductivity type, for example.

The ninth transistor "M9" is connected to the second power supply rail "VL2" at one end (source) thereof and to the second output terminal "TOUT2" at another end (drain) thereof and is diode-connected.

The tenth transistor "M10" is connected to the second power supply rail "VL2" at one end (source) thereof, to the second node "N2" at another end (drain) thereof and to a control terminal (gate) of the ninth transistor "M9" at a control terminal (gate) thereof.

The third current mirror circuit "CA3" is configured to flow a third mirror current, which is a mirror current of a current flowing between the first power supply rail "VL1" and a third node "N3", between the first power supply rail "VL1" and a fourth node "N4", which is connected to a control terminal (gate) of the first transistor "M1".

As shown in FIG. 1, the third current mirror circuit "CA3" includes an eleventh transistor (pMOS transistor) "M11" of the first conductivity type and a twelfth transistor (pMOS transistor) "M12" of the first conductivity type, for example.

The eleventh transistor "M11" is connected to the first power supply rail "VL1" at one end (source) thereof and to the third node "N3" at another end (drain) thereof and is diode-connected.

The twelfth transistor "M12" is connected to the first power supply rail "VL1" at one end (source) thereof, to the fourth node "N4" at another end (drain) thereof and to a control terminal (gate) of the eleventh transistor "M11" at a control terminal (gate) thereof.

The fourth current mirror circuit "CA4" is configured to flow a fourth mirror current, which is a mirror current of a current (first mirror current) flowing between the second power supply rail "VL2" and a fifth node "N5", between the second power supply rail "VL2" and a sixth node "N6", which is connected to a control terminal (gate) of the second transistor "M2".

As shown in FIG. 1, the fourth current mirror circuit "CA4" includes a thirteenth transistor (nMOS transistor) "M13" of the second conductivity type and a fourteenth transistor (nMOS transistor) "M14" of the second conductivity type, for example.

The thirteenth transistor "M13" is connected to the second power supply rail "VL2" at one end (source) thereof and to the fifth node "N5" at another end (drain) thereof and is diode-connected.

The fourteenth transistor "M14" is connected to the second power supply rail "VL2" at one end (source) thereof, to a sixth node "N6" at another end (drain) thereof and to a control terminal (gate) of the thirteenth transistor "M13" at a control terminal (gate) thereof.

The fifth current mirror circuit "CA5" is configured to flow a fifth mirror current, which is a mirror current of a current (second mirror current) flowing between the third node "N3" and the second node "N2", between the fourth node "N4" and the sixth node "N6".

As shown in FIG. 1, the fifth current mirror circuit "CA5" includes a fifteenth transistor (pMOS transistor) "M15" of the first conductivity type and a sixteenth transistor (pMOS transistor) "M12" of the first conductivity type, for example.

The fifteenth transistor "M15" is connected to the third node "N3" at one end (source) thereof and to the second node "N2" at another end (drain) thereof and is diode-connected.

The sixteenth transistor "M16" is connected to the fourth node "N4" at one end (source) thereof, to the sixth node "N6" at another end (drain) thereof and to a control terminal (gate) of the fifteenth transistor "M15" at a control terminal (gate) thereof.

The sixth current mirror circuit "CA6" is configured to flow a sixth mirror current, which is a mirror current of a current (first mirror current) flowing between the fifth node "N5" and the first node "N1", between the sixth node "N6" and the fourth node "N4".

As shown in FIG. 1, the sixth current mirror circuit "CA6" includes a seventeenth transistor (nMOS transistor) "M17" of the second conductivity type and an eighteenth transistor (nMOS transistor) "M18" of the second conductivity type, for example.

The seventeenth transistor "M17" is connected to the fifth node "N5" at one end (source) thereof and to the first node "N1" at another end (drain) thereof and is diode-connected.

The eighteenth transistor "M18" is connected to the sixth node "N6" at one end (source) thereof, to the fourth node "N4" at another end (drain) thereof and to a control terminal (gate) of the seventeenth transistor "M17" at a control terminal (gate) thereof.

A first mirror ratio (1:s) of the first current mirror circuit "CA1", that is, the area ratio between the seventh and eighth transistors "M7" and "M8", is set to be equal to a second mirror ratio (1:s) of the second current mirror circuit "CA2", that is, the area ratio between the ninth and tenth transistors "M9" and "M10". That is, s≥1. In addition, a third mirror ratio (1:2 m) of the third current mirror circuit "CA3", that is, the area ratio between the eleventh and twelfth transistors "M11" and "M12" is set to be equal to a fourth mirror ratio (1:2 m) of the fourth current mirror circuit "CA4", that is, the area ratio between the thirteenth and fourteenth transistors "M13" and "M14". That is, m≥1.

In addition, a fifth mirror ratio (1:m) of the fifth current mirror circuit "CA5", that is, the area ratio between the fifteenth and sixteenth transistors "M15" and "M16" is set to be equal to a sixth mirror ratio (1:m) of the sixth current mirror circuit "CA6", that is, the area ratio between the seventeenth and eighteenth transistors "M17" and "M18".

As described above, the third and fourth mirror ratios (1:2m) are twice as high as the fifth and sixth mirror ratios (1:m).

In addition, as shown in FIG. 1, the current feedback circuit 101 is configured to supply a current responsive to a voltage at the signal output terminal "TOUT" to the inverting input terminal "TINM".

As shown in FIG. 1, the current feedback circuit 101 includes a first resistor "Rf" and a second resistor "Rs".

The first resistor "Rf" is connected to the inverting input terminal "TINM" at one end thereof and to the signal output terminal "TOUT" at another end thereof.

The second resistor "Rs" is connected to the inverting input terminal "TINM" at one end thereof and to a reference terminal "Tref", to which a reference voltage "Vref" is applied, at another end thereof.

The reference voltage "Vref" is set at a voltage between the first voltage "V1" and the second voltage "V2". More preferably, the reference voltage "Vref" is set midway between the first voltage "V1" and the second voltage "V2" (at an intermediate voltage (V1−V2)/2).

The current feedback output circuit 100 configured as described above is configured to flow a constant bias current to the first transistor "M1" and the second transistor "M2" if an input signal (alternating-current signal) "Vin" supplied to the non-inverting input terminal "TINP" is zero.

Furthermore, the current feedback output circuit 100 is configured to increase the current flowing to the first transistor "M1" and decrease the current flowing to the second transistor "M2" if the input signal (alternating-current signal) "Vin" supplied to the non-inverting input terminal "TINP" is positive.

Furthermore, the current feedback output circuit 100 is configured to decrease the current flowing to the first transistor "M1" and increase the current flowing to the second transistor "M2" if the input signal (alternating-current signal) "Vin" supplied to the non-inverting input terminal "TINP" is negative.

Figure 2:
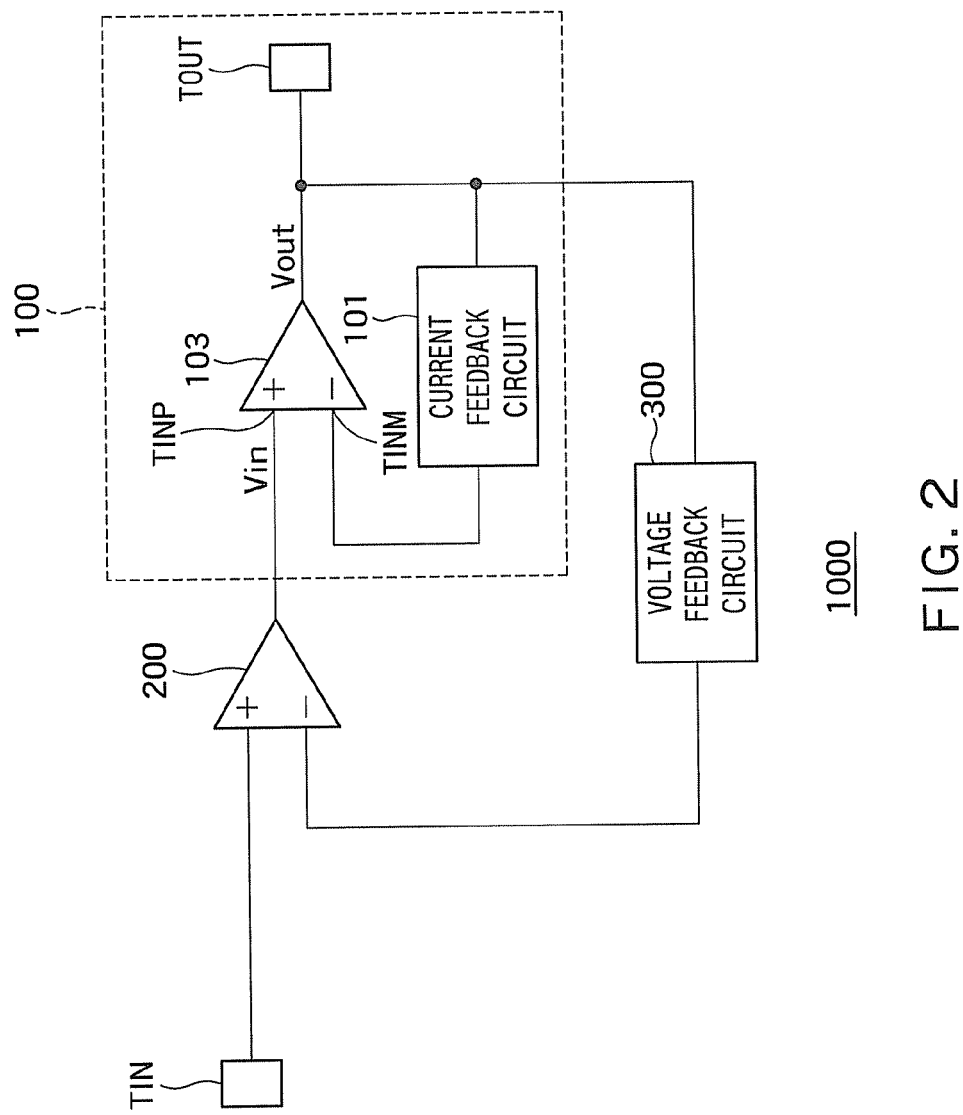
FIG. 2 is a diagram showing an example of a configuration of a power amplifying circuit 1000 to which the current feedback output circuit 100 shown in FIG. 1 is applied.

FIG. 2 is a diagram showing an example of a configuration of a power amplifying circuit 1000 to which the current feedback output circuit 100 shown in FIG. 1 is applied.

As shown in FIG. 2, the power amplifying circuit 1000 includes the current feedback output circuit 100 (the amplifier 103 and the current feedback circuit 101), an amplifier 200 and a voltage feedback circuit 300.

The voltage feedback circuit 300 is configured to output a feedback voltage based on the output voltage "Vout" at the output terminal "TOUT".

The amplifier 200 is configured to amplify the difference between a voltage input to the non-inverting input terminal from the input terminal "TIN" and the feedback voltage and output the resulting voltage as an input voltage "Vin" for the current feedback output circuit 100.

The power amplifying circuit 1000 is controlled so that the voltage feedback circuit 300, the amplifier 200 and the current feedback output circuit 100 set the output voltage "Vout" at the intermediate voltage (V1−V2)/2 when no input signal is supplied to the non-inverting input terminal "TINP" (under a no-signal condition).

Next, an example of an operation of the current feedback output circuit 100 configured as described above will be described with respect to the state of the input signal (alternating-current signal) input to the non-inverting input terminal "TINP". In the following description, it will be assumed that the above-mentioned values "n", "s", "m" and "t" are 1, 1, 1 and 100, respectively, (n=1, s=1, m=1 and t=100).

(A) First, a case where no input signal (alternating-current signal) "Vin" is input to the non-inverting input terminal "TINP" (under a no-signal condition) will be described with reference to FIG. 1.

It is assumed that, when there is no alternating-current signal at the input terminal "TINP" (no input signal "Vin" is input to the input terminal "TINP"), a DC bias that makes a voltage "Vx" between the third transistor "M3" and the fourth transistor "M4" equal to the reference voltage "Vref" is applied to the input terminal "TINP". The DC bias is supplied from a voltage source or a current source that meets the requirement described above, for example.

When no input signal "Vin" is input, the currents flowing through the third and fifth transistor "M3" and "M5" are equal to the current "I1", and the current "I1" flows through the seventh and eighth transistors "M7" and "M8". Furthermore, the currents flowing through the fourth and sixth transistors "M4" and "M6" are also equal to the current "I1", and the current "I1" flows through the ninth and tenth transistors "M9" and "M10".

In addition, the current "I1" flows through the fifteenth and seventeenth transistors "M15" and "M17".

Furthermore, the current "I1" flows through the eleventh and thirteenth transistors "M11" and "M13". A current (2×I1) twice as high as the current "I1" flows through the twelfth and fourteenth transistors "M12" and "M14", the area ratio of which to the eleventh and thirteenth transistors "M11" and "M13" is 2:1.

Next, the current flowing through the sixteenth and eighteenth transistors "M16" and "M18" will be determined.

First, it is assumed that the current flowing through the sixteenth transistor "M16" is the current "I1".

On this assumption, since the current (2×I1) flows through the fourteenth transistor "M14", the differential current "I1" flows through the eighteenth transistor "M18".

On the other hand, the current flowing through the twelfth transistor "M12" is also the current (2×I1), so that the current "I1" flows through the eighteenth transistor "M18". Thus, there is no contradiction.

Then, the currents flowing through the seventeenth and eighteenth transistors "M17" and "M18" are equal to the current "I1", and the seventeenth and eighteenth transistors "M17" and "M18" have an equal gate-source voltage because of their area ratio of 1:1. Therefore, the gate-source voltage of the thirteenth transistor "M13" and the gate-source voltage of the second transistor "M2" are equal to each other.

On the other hand, the currents flowing through the fifteenth and sixteenth transistors "M15" and "M16" are equal to the current "I1", and the fifteenth and sixteenth transistors "M15" and "M16" have an equal gate-source voltage because of their area ratio of 1:1. Therefore, the gate-source voltage of the eleventh transistor "M11" and the gate-source voltage of the first transistor "M1" are equal to each other.

That is, the current flowing through the second transistor "M2" is determined by the area ratio between the thirteenth transistor "M13" and the second transistor "M2". And the current flowing through the first transistor "M1" is determined by the area ratio between the eleventh transistor "M11" and the first transistor "M1".

In this example, the area ratios between the first and eleventh transistors "M1" and "M11" and between the second and thirteenth transistors "M2" and "M13" are 100:1. Therefore, an idle current in the case where the input signal "Vin" to the non-inverting input terminal "TINP" is zero is the current (100×I1).

In the above description, it has been assumed that the equal current flows through the sixteenth and eighteenth transistors "M16" and "M18". In actual, however, the current "I1" may contain a current error $\Delta I$.

For example, if the current flowing through the sixteenth transistor "M16" is $I1+\Delta I$, the current flowing through the eighteenth transistor "M18" is $I1-\Delta I$.

In this case, compared with the gate-source voltage of the fifteenth transistor "M15", the gate-source voltage of the sixteenth transistor "M16" is greater by $\Delta V$. On the other hand, compared with the gate-source voltage of the seventeenth transistor "M17", the gate-source voltage of the eighteenth transistor "M18" is smaller by $\Delta V$.

The voltage $\Delta V$ can be considered as the current $\Delta I$ divided by the transfer conductance "gm" of each transistor.

Therefore, the gate voltage of the first transistor "M1" is $Vgs(M11)-\Delta V$, and the gate voltage of the second transistor "M2" is $Vgs(M13)+\Delta V$.

Therefore, the current flowing through the first transistor "M1" is smaller than 100×I1, and the current flowing through the second transistor "M2" is greater than 100×I1.

However, as shown in FIG. 2, under the no-signal condition, the signal output terminal "TOUT" is generally controlled by the resistive voltage feedback circuit 300 so that the output voltage "Vout" is equal to the intermediate voltage (V1-V2)/2. In other words, in order to maintain the output voltage "Vout" at the output terminal "TOUT" at the intermediate voltage (V1-V2)/2, the voltage at the input terminal "TINP" can be adjusted by the action of the voltage feedback circuit 300 so that the difference between the currents through the first and second transistors "M1" and "M2" is zero.

As a result, the bias is stabilized so that the currents through the first and second transistors "M1" and "M2" are 100×I1.

As described above, with a simple configuration, the current feedback output circuit 100 can more accurately determine the idle current (the current under the no-signal condition) through the first and second transistors (output transistors).

Note that the values of the first and second resistors "Rf" and "Rs" and the reference voltage "Vref" have no influence on the operation of the current feedback output circuit 100, in particular, under the no-signal condition.

However, if Vout≠Vref, a direct current (Vout−Vref)/(Rs+Rf) flows to the output terminal "TOUT". Therefore, the reference voltage "Vref" is preferably at the same potential as the output voltage "Vout" at the signal output terminal "TOUT" under the no-signal condition.

(B) Next, a case where the input signal (alternating-current signal) "Vin" is input to the non-inverting input terminal "TINP" will be described.

For example, in a case where a signal in a positive direction is applied to the input terminal "TINP", the voltage "Vx" at the point of connection between the third transistor "M3" and the fourth transistor "M4" is higher than the voltage at the inverting input terminal "TINM".

Therefore, the current through the fifth transistor "M5" is greater than the current "I1" by $\Delta I1$. On the other hand, the current through the sixth transistor "M6" is smaller than the current "I1" by $\Delta I1$. The current through the fifth transistor "M5" is copied by the seventh and eighth transistors "M7" and "M8", and the current flowing through the thirteenth transistor "M13" increases by ΔI1. Therefore, the current through the fourteenth transistor "M14" also increases by 2×ΔI1. Since the current flowing through the seventeenth transistor "M17" increases by ΔI1, the current flowing through the eighteenth transistor "M18" increases by ΔI1.

On the other hand, the current through the sixth transistor "M6" is copied by the ninth and tenth transistors "M9" and "M10", and the current flowing through the eleventh transistor "M11" decreases by ΔI1. Therefore, the current through the twelfth transistor "M12" also decreases by 2×ΔI1. Since the current flowing through the fifteenth transistor "M15" decreases by ΔI1, the current flowing through the sixteenth transistor "M16" decreases by ΔI1.

Therefore, the current at the gate of the first transistor "M1" decreases by 2×ΔI1. That is, the gate-source voltage of the first transistor "M1" is greater than the gate-source voltage of the eleventh transistor "M11".

Therefore, compared with the voltage under the no-signal condition, the gate-source voltage of the first transistor "M1" increases.

On the other hand, the current at the gate of the second transistor "M2" decreases by 2×ΔI1. That is, the gate-source voltage of the second transistor "M2" is smaller than the gate-source voltage of the thirteenth transistor "M13".

That is, compared with the voltage under the no-signal condition, the gate-source voltage of the second transistor "M2" decreases.

Therefore, in the case where a signal in the positive direction is applied to the input terminal "TINP", the current through the first transistor "M1" increases, the current through the second transistor "M2" decreases, and therefore, the signal output terminal "TOUT" operates to swing upward.

If the signal output terminal "TOUT" swings upward, a current flows to the inverting input terminal "TINM" through the first resistor "Rf". Since the inverting input terminal "TINM" has a low input impedance, the current flowing to the inverting input terminal "TINM" causes the current through the sixth transistor "M6" to increase by ΔI2. The increment ΔI2 is copied by the ninth and tenth transistors "M9" and "M10", and the current flowing through the eleventh and fifteenth transistors "M11" and "M15" also increase by ΔI2. Since the current flowing through the eleventh transistor "M11" increases by ΔI2, the current through the twelfth transistor "M12" also increases by 2×ΔI2. Since the current through the fifteenth transistor "M15" increases by ΔI2, the current through the sixteenth transistor "M16" also increases by ΔI2.

Therefore, the current to the gate of the first transistor "M1" increases by ΔI2, and therefore, the gate-source voltage of the first transistor "M1" decreases.

On the other hand, the current to the gate of the second transistor "M2" increases by ΔI2, and therefore, the gate-source voltage of the second transistor "M2" increases.

Therefore, the signal output terminal "TOUT" is prevented from swinging upward.

That is, the first and second resistors "Rf" and "Rs" operates as the feedback circuit 101 and serves to prevent the output circuit from having an excessive gain.

On the other hand, in a case where a signal in a negative direction is applied to the non-inverting input terminal "TINP", the voltage "Vx" at the point of connection between the third transistor "M3" and the fourth transistor "M4" is lower than the voltage at the inverting input terminal "TINM".

Therefore, the current through the fifth transistor "M5" is smaller than the current "I1" by ΔI1. On the other hand, the current through the sixth transistor "M6" is greater than the current "I1" by ΔI1.

The current through the fifth transistor "M5" is copied by the seventh and eighth transistors "M7" and "M8", and the current flowing through the thirteenth transistor "M13" decreases by ΔI1. Therefore, the current through the fourteenth transistor "M14" also decreases by 2×ΔI1. Since the current flowing through the seventeenth transistor "M17" decreases by ΔI1, the current flowing through the eighteenth transistor "M18" decreases by ΔI1.

On the other hand, the current through the sixth transistor "M6" is copied by the ninth and tenth transistors "M9" and "M10", and the current flowing through the eleventh transistor "M11" increases by ΔI1. Therefore, the current through the twelfth transistor "M12" also increases by 2×ΔI1. Since the current flowing through the fifteenth transistor "M15" increases by ΔI1, the current flowing through the sixteenth transistor "M16" increases by ΔI1. Therefore, the current at the gate of the first transistor "M1" increases by 2×ΔI1. That is, the gate-source voltage of the first transistor "M1" is smaller than the gate-source voltage of the eleventh transistor "M11".

Therefore, compared with the voltage under the no-signal condition, the gate-source voltage of the first transistor "M1" decreases.

On the other hand, the current at the gate of the second transistor "M2" increases by 2×ΔI1. That is, the gate-source voltage of the second transistor "M2" is greater than the gate-source voltage of the thirteenth transistor "M13".

That is, compared with the voltage under the no-signal condition, the gate-source voltage of the second transistor "M2" increases.

Therefore, in the case where a signal in the negative direction is applied to the input terminal "TINP", the current through the first transistor "M1" decreases, the current through the second transistor "M2" increases, and therefore, the signal output terminal "TOUT" operates to swing downward.

If the signal output terminal "TOUT" swings downward, a current flows from the inverting input terminal "TINM" through the first resistor "Rf". Since the inverting input terminal "TINM" has a low input impedance, that current flowing from the inverting input terminal "TINM" causes the current through the fifth transistor "M5" to increase by ΔI2. The increment ΔI2 is copied by the seventh and eighth transistors "M7" and "M8", and the current flowing through the thirteenth "M13" increases by ΔI2, so that the current through the fourteenth transistor "M14" also increases by 2×ΔI2. Since the current flowing through the seventeenth transistor "M17" increases by ΔI2, the current through the eighteenth transistor "M18" also increases by ΔI2.

Therefore, the current at the gate of the first transistor "M1" decreases by ΔI2, and therefore, the gate-source voltage of the first transistor "M1" increases.

On the other hand, the current at the gate of the second transistor "M2" decreases by ΔI2, and therefore, the gate-source voltage of the second transistor "M2" decreases.

Thus, the signal output terminal "TOUT" is prevented from swinging downward. That is, the current feedback circuit 101 operates and serves to prevent the current feedback output circuit 100 from having an excessive gain.

Figure 3:
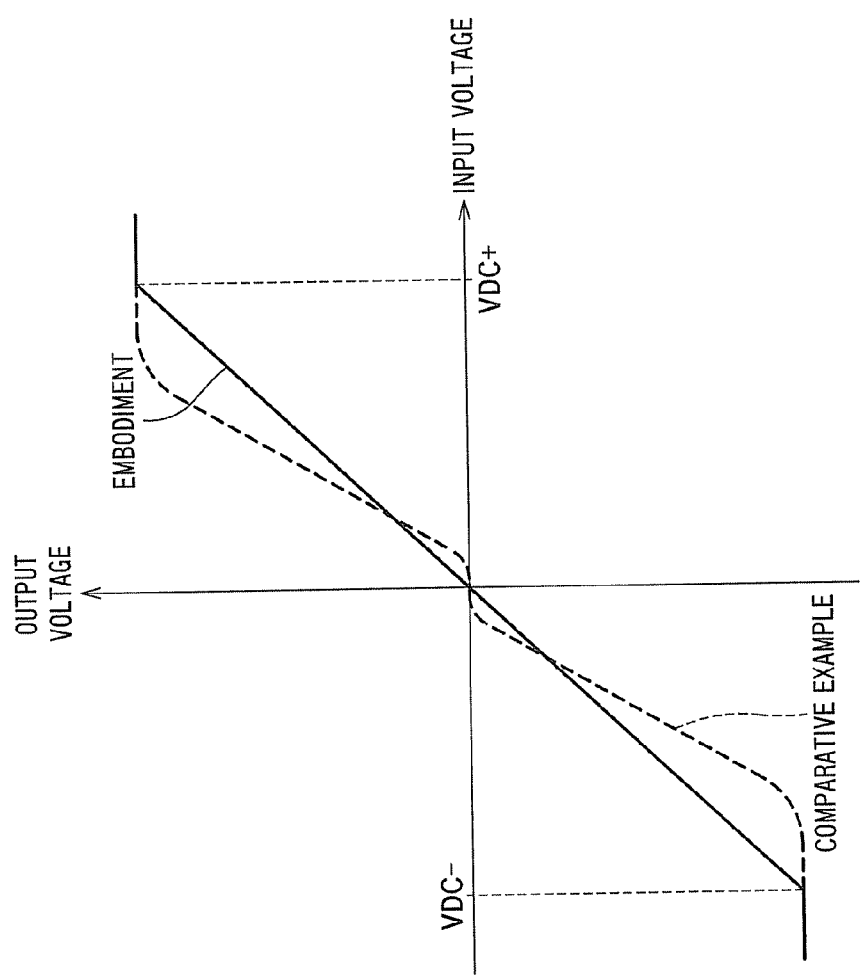
FIG. 3 is a graph showing an example of a relationship (transfer characteristics) between the direct-current (DC) voltage supplied to the non-inverting input terminal of the current feedback output circuit 100 according to the first embodiment and the output voltage "Vout"

FIG. 3 is a graph showing an example of a relationship (transfer characteristics) between the direct-current (DC) voltage supplied to the non-inverting input terminal of the current feedback output circuit 100 according to the first embodiment and the output voltage "Vout". In FIG. 3, the solid line shows transfer characteristics of the current feedback output circuit according to the first embodiment. As a comparative example, the dotted line shows transfer characteristics of a common output circuit.

As shown in FIG. 3, the transfer characteristics of the output circuit according to the comparative example have high symmetry but have poor linearity.

On the other hand, the current feedback output circuit 100 according to the first embodiment is superior not only in the symmetry between the circuit that drives the first transistor (p-channel-side output transistor) and the circuit that drives the second transistor (n-channel-side output transistor) but also in the linearity.

Figure 4:
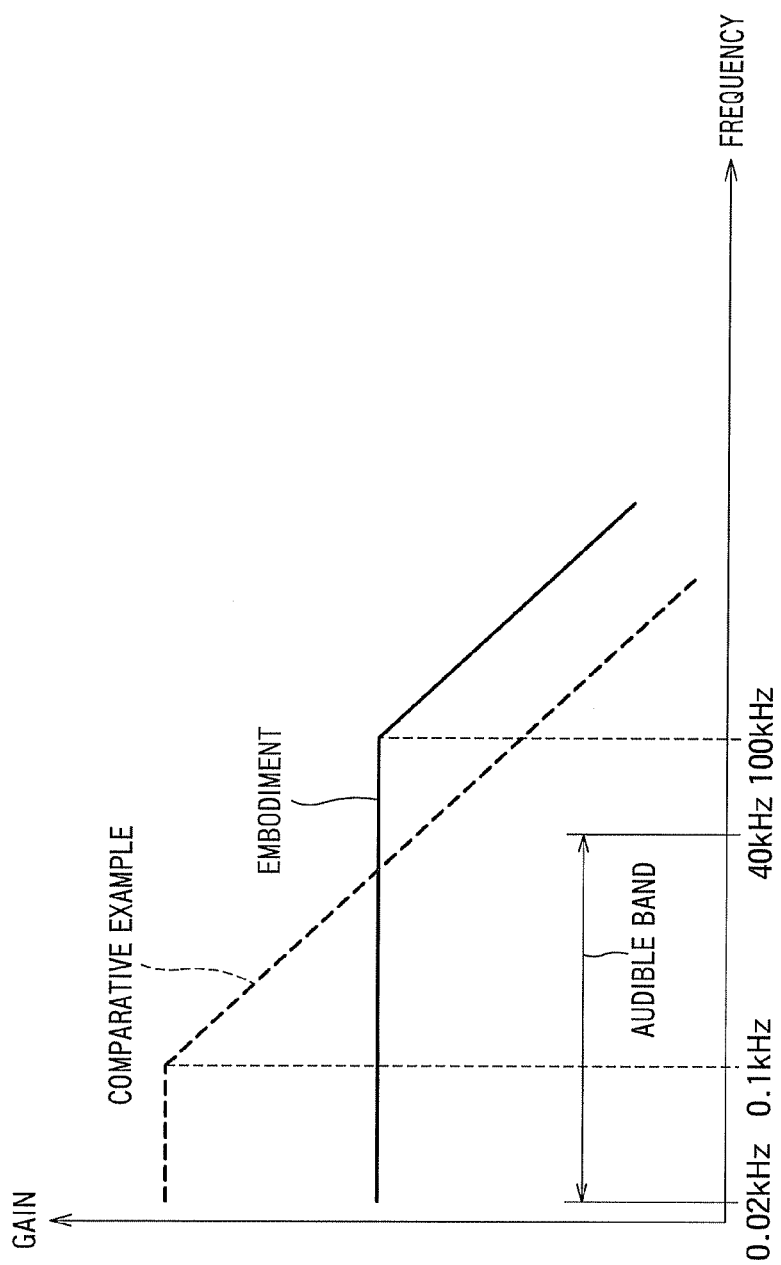
FIG. 4 is a graph showing an example of a relationship (frequency characteristics) between the frequency of the alternating-current signal supplied to the non-inverting input terminal of the current feedback output circuit 100 according to the first embodiment and the output gain.

FIG. 4 is a graph showing an example of a relationship (frequency characteristics) between the frequency of the alternating-current signal supplied to the non-inverting input terminal of the current feedback output circuit 100 according to the first embodiment and the output gain. In FIG. 4, the solid line shows frequency characteristics of the current feedback output circuit 100 according to the first embodiment. As a comparative example, the dotted line shows frequency characteristics of a common output circuit.

As shown in FIG. 4, the output circuit according to the comparative example has high gain in an audible band (from 0.02 kHz to 40 kHz), for example, but has poor frequency characteristics.

On the other hand, the current feedback output circuit 100 according to the first embodiment does not have an excessive gain in the audible band and has high frequency characteristics accordingly.

Therefore, the current feedback output circuit 100 according to the first embodiment can provide an audio power amplifying circuit with high sound quality that is superior to the prior art in both linearity and frequency characteristics.

(C) Next, a case where a high input signal "Vin" is applied to the non-inverting input terminal "TINP", and a clipping occurs at the output terminal "TOUT" (a case where the input voltage shown in FIG. 3 is equal to or higher than a voltage "VDC+" or equal to or lower than a voltage "VDC−") will be described.

In a case where a high signal in the positive direction is applied to the input terminal "TINP", the voltage "Vx" at the point of connection between the third transistor "M3" and the fourth transistor "M4" is higher than the reference voltage "Vref". As a result, the current through the fifth transistor "M5" considerably increases, while the current through the sixth transistor "M6" becomes substantially zero.

If the current through the sixth transistor "M6" becomes zero, the currents through the ninth, tenth, eleventh, twelfth, fifteenth and sixteenth transistors "M9", "M10", "M11", "M12", "M15" and "M16" also become substantially zero.

To the contrary, since the current through the fifth transistor "M5" considerably increases, the currents through the seventh, eighth, thirteenth, fourteenth, seventeenth and eighteenth transistors "M7", "M8", "M13", "M14" "M17" and "M18" also considerably increase.

Since the currents through the fourteenth and eighteenth transistors "M14" and "M18" considerably increases, while the currents through the twelfth and sixteenth transistors "M12" and "M16" are zero, the gate-source voltage of the first transistor "M1" further increases. The gate-source voltage of the first transistor "M1" increases as far as the eighteenth transistor "M18" can conduct a current.

The ratio between the currents through the seventeenth and eighteenth transistors "M17" and "M18" is approximately equal to 1:2, so that the gate voltage of the second transistor "M2" settles at a value slightly smaller than the gate-source voltage of the thirteenth transistor "M13".

In this way, the gate of the second transistor "M2" is discharged with the current through the fourteenth transistor "M14", so that the discharge can be achieved quickly.

In addition, the gate of the first transistor "M1" is charged with the current through the eighteenth transistor "M18", so that the charging can be achieved quickly, and the maximum value of the gate-source voltage of the first transistor "M1" can be increased.

Note that a current tends to flow from the signal output terminal "TOUT" to the inverting input terminal "TINM" via the first and second resistors "Rf" and "Rs". However, the current through the sixth transistor "M6" is substantially zero, and the input impedance is high. Therefore, the current from the signal output terminal "TOUT" flows to the reference terminal "Tref".

That is, when a high input signal "Vin" is applied, the current feedback circuit 101 does not operate as a feedback circuit.

In a case where a high input signal "Vin" in the negative direction is applied to the input terminal "TINP", the voltage "Vx" at the point of connection between the third transistor "M3" and the fourth transistor "M4" is lower than the reference voltage "Vref". As a result, the current through the sixth transistor "M6" considerably increases, while the current through the fifth transistor "M5" becomes substantially zero.

If the current through the fifth transistor "M5" becomes zero, the currents through the seventh, eighth, thirteenth, fourteenth, seventeenth and eighteenth transistors "M7", "M8", "M13", "M14" "M17" and "M18" also become substantially zero.

On the other hand, since the current through the sixth transistor "M6" considerably increases, the currents through the ninth, tenth, eleventh, twelfth, fifteenth and sixteenth transistors "M9", "M10", "M11", "M12", "M15" and "M16" also considerably increase.

Since the currents through the twelfth and sixteenth transistors "M12" and "M16" considerably increases, while the currents through the fourteenth and eighteenth transistors "M14" and "M18" are zero, the gate-source voltage of the second transistor "M2" further increases. The gate voltage of the second transistor "M2" increases as far as the sixteenth transistor "M16" can conduct a current.

The ratio between the currents through the fifteenth and sixteenth transistors "M15" and "M16" is approximately equal to 1:2. Therefore, the gate-source voltage of the first transistor "M1" converges to a value slightly smaller than the gate-source voltage of the eleventh transistor "M11".

In this way, the gate of the first transistor "M1" is discharged through the current of the twelfth transistor "M12", so that the discharge can be achieved quickly.

In addition, the gate of the second transistor "M2" is charged with the current through the sixteenth transistor "M16", so that the gate of the second transistor "M2" can be quickly charged, and the maximum value of the gate voltage of the second transistor "M2" can be increased.

Note that a current tends to flow from the inverting input terminal "TINM" to the output terminal "TOUT" via the first and second resistors "Rf" and "Rs". However, the current through the fifth transistor "M5" is substantially zero, and the input impedance is high. Therefore, the current to the signal output terminal "TOUT" flows out from the reference terminal "Tref".

That is, when a high input signal "Vin" is applied, the current feedback circuit 101 does not operate as a feedback circuit.

As described above, in the case where a clipping occurs at the output terminal, the gates of the first and second transistors "M1" and "M2" can be quickly charged with high amplitude or quickly discharged.

Therefore, the amplitude of the gate voltage of each of the first and second transistors "M1" and "M2" can increased, and the maximum output power can be increased.

In addition, not only charging but also discharging of the gates (gate capacitances) of the first and second transistors "M1" and "M2" can be quickly achieved, simultaneous turning on of the upper and lower transistors, the first and second transistors "M1" and "M2", can be advantageously prevented.

That is, the current feedback output circuit 100 according to the first embodiment is superior in symmetry between the driving circuit for a push-side (p-channel-side) output transistor and the driving circuit for a pull-side (n-channel-side) output transistor and in linearity and symmetry of the transfer characteristics and can operate in a wide band with a low voltage.

With the current feedback output circuit 100, an audio power amplifying circuit with high sound quality can be provided.

Furthermore, the current feedback output circuit 100 according to the first embodiment can accurately determine the idle current of each output transistor (the current under the no-signal condition) and increase the amplitude of the gate voltage of each output transistor and the maximum output power with a simple configuration.

Furthermore, since the current feedback output circuit 100 according to the first embodiment can accurately determine the idle current, the current feedback output circuit 100 consumes reduced power.

Furthermore, the current feedback output circuit 100 according to the first embodiment can not only quickly charge the gate (gate capacitance) of each output transistor but also quickly discharge the gate of each output transistor and can advantageously prevent simultaneous turning on of the upper and lower output transistors.

As described above, the current feedback output circuit according to the first embodiment has improved transfer characteristics.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A power amplifying circuit comprising:
    an input terminal;
    a signal output terminal;
    a voltage feedback circuit configured to generate a voltage in accordance with a voltage at the signal output terminal;
    a current feedback circuit configured to generate a current in accordance with the voltage at the signal output terminal;
    a first amplifier circuit, a voltage from the input terminal being inputted to a non-inverting terminal thereof, the voltage generated by the voltage feedback circuit being inputted to an inverting terminal thereof, and an input voltage being outputted therefrom; and
    a second amplifier circuit, the input voltage being inputted to a non-inverting terminal thereof, the current generated by the current feedback circuit being inputted to an inverting terminal thereof, and an output signal therefrom being outputted to the signal output terminal,
    wherein the second amplifier circuit includes a current amplifier configured to generate a current in accordance with the input voltage.

2. The power amplifying circuit according to claim 1, wherein the current feedback circuit includes a first resistor that is connected, at a first end of a current path thereof, to the inverting terminal of the second amplifier circuit, and connected, at a second end of the current path thereof, to a reference terminal to which a reference voltage is applied.

3. The power amplifying circuit according to claim 2, wherein the current feedback circuit includes a second resistor that is connected, at a first end of a current path thereof, to the first end of the first resistor, and connected, at a second end of the current path thereof, to the signal output terminal.

4. The power amplifying circuit according to claim 2, wherein the second amplifier circuit includes:
    a first transistor of a first conductivity type that is connected, at a first end of a current path thereof, to a first power supply rail to which a first voltage is applied, and connected, at a second end of the current path thereof, to the signal output terminal; and
    a second transistor of a second conductivity type that is connected, at a first end of a current path thereof, to a second power supply rail to which a second voltage that is lower than the first voltage is applied, and connected, at a second end of the current path thereof, to the signal output terminal, and
    wherein the reference voltage is lower than the first voltage and higher than the second voltage.

5. The power amplifying circuit according to claim 4, wherein the reference voltage is an intermediate voltage between the first voltage and the second voltage.

6. The current feedback output circuit according to claim 1, wherein the current amplifier comprises:
    a current source that is connected to the first power supply rail at a first end thereof and outputs a current;
    a third transistor of the second conductivity type that is connected to a second end of the current source at a first end thereof and is diode-connected;
    a fourth transistor of the first conductivity type that is connected to a second end of the third transistor at a first end thereof and to the non-inverting input terminal at a second end thereof and is diode-connected;
    a fifth transistor of the second conductivity type that is connected to a first output terminal at a first end thereof, to the inverting input terminal at a second end thereof and to a control terminal of the third transistor at a control terminal thereof; and
    a sixth transistor of the first conductivity type that is connected to the inverting input terminal at a first end thereof, to a second output terminal at a second end thereof and to a control terminal of the fourth transistor at a control terminal thereof;
    wherein the current amplifier is configured to pass a current obtained by amplifying a difference between a current inputted to the non-inverting terminal and a current inputted to the inverting terminal as the difference of the current between the first output terminal and the second output terminal.

7. The power amplifying circuit according to claim 6, wherein an area ratio between the third transistor and the fifth transistor is identical to an area ratio between the fourth transistor and the sixth transistor.

8. The power amplifying circuit according to claim 7, wherein the fifth transistor is larger in area than the third transistor, and the sixth transistor is larger in area than the fourth transistor.

9. The power amplifying circuit according to claim 6, wherein the third transistor and the fifth transistor form a first current mirror circuit and the fourth transistor and the sixth transistor form a second current mirror circuit, a mirror ratio of the first current mirror circuit being identical to a mirror ratio of the second current mirror circuit.

* * * * *